United States Patent
Fei et al.

(10) Patent No.: US 10,446,707 B2
(45) Date of Patent: Oct. 15, 2019

(54) OPTICAL WAVEGUIDE DETECTOR AND OPTICAL MODULE

(71) Applicants: Huawei Technologies Co., Ltd., Shenzhen (CN); Peking University, Beijing (CN)

(72) Inventors: Yonghao Fei, Chengdu (CN); Jishi Cui, Beijing (CN); Yisheng Zhu, Shenzhen (CN)

(73) Assignees: Huawei Technologies Co., Ltd., Shenzhen (CN); Peking University, Beijing (CN)

(*) Notice: Subject to any disclaimer, the term of this patent is extended or adjusted under 35 U.S.C. 154(b) by 0 days.

(21) Appl. No.: 16/001,653

(22) Filed: Jun. 6, 2018

(65) Prior Publication Data

US 2018/0294365 A1    Oct. 11, 2018

Related U.S. Application Data

(63) Continuation of application No. PCT/CN2016/092994, filed on Aug. 3, 2016.

(30) Foreign Application Priority Data

Feb. 29, 2016 (CN) .......................... 2016 1 0113602

(51) Int. Cl.
*H01L 31/105* (2006.01)
*G02B 6/12* (2006.01)
(Continued)

(52) U.S. Cl.
CPC .............. *H01L 31/105* (2013.01); *G02B 6/12* (2013.01); *H01L 31/102* (2013.01);
(Continued)

(58) Field of Classification Search
None
See application file for complete search history.

(56) References Cited

U.S. PATENT DOCUMENTS 7,453,132 B1    11/2008 Gunn, III et al.
8,148,794 B2    4/2012 Masini et al.
(Continued)

FOREIGN PATENT DOCUMENTS

CN    104380159 A    2/2015
CN    105655417 A    6/2016
(Continued)

OTHER PUBLICATIONS

Chen et al., "High-Responsivity Low-Voltage 28-Gb/s Ge p-i-n Photodetector With Silicon Contacts," Journal of Lightwave Technology, vol. 33, No. 4, XP011573641, pp. 820-824, Institute of Electrical and Electronics Engineers, New York, New York (Feb. 15, 2015).

*Primary Examiner* — Jerry Rahll
(74) *Attorney, Agent, or Firm* — Leydig, Voit & Mayer, Ltd.

(57) ABSTRACT

An optical waveguide detector is provided, which includes: a silicon waveguide layer and a germanium waveguide layer. The germanium waveguide layer includes a first heavily germanium-doped area and a germanium-undoped area. A first surface of the germanium waveguide layer includes a surface of the first heavily germanium-doped area, and the first surface is a surface of the germanium waveguide layer away from the silicon waveguide layer in the first direction. A width of the first heavily germanium-doped area is less than or equal to half a width of the first surface, and a thickness of the first heavily germanium-doped area is greater than or equal to 5 nm and less than or
(Continued)

equal to 200 nm. According to embodiments, a bandwidth of the optical waveguide detector can be effectively increased.

20 Claims, 6 Drawing Sheets

(51) Int. Cl.
    *H01L 31/102*     (2006.01)
    *H01L 31/028*     (2006.01)
    *H01L 31/0232*     (2014.01)
    *H01L 31/0288*     (2006.01)
    *H01L 31/18*     (2006.01)
    *H01L 31/0224*     (2006.01)
    *H01L 31/0352*     (2006.01)

(52) U.S. Cl.
    CPC .. *G02B 2006/12061* (2013.01); *H01L 31/028* (2013.01); *H01L 31/0288* (2013.01); *H01L 31/02327* (2013.01); *H01L 31/022408* (2013.01); *H01L 31/03529* (2013.01); *H01L 31/1804* (2013.01); *Y02P 70/521* (2015.11)

(56) References Cited

U.S. PATENT DOCUMENTS

| | | |
|---|---|---|
| 2010/0295083 A1 | 11/2010 | Celler |
| 2014/0112617 A1 | 4/2014 | Pagani et al. |
| 2014/0332918 A1 | 11/2014 | Li et al. |
| 2015/0028386 A1 | 1/2015 | Shi et al. |
| 2016/0155863 A1* | 6/2016 | Baehr-Jones ....... H01L 31/1808 |
| | | 250/338.4 |

FOREIGN PATENT DOCUMENTS

| | | |
|---|---|---|
| EP | 2523026 A1 | 11/2012 |
| WO | 2006066611 A1 | 6/2006 |
| WO | 2008128202 A2 | 10/2008 |
| WO | 2013180690 A1 | 12/2013 |

\* cited by examiner

OPTICAL WAVEGUIDE DETECTOR AND OPTICAL MODULE

CROSS-REFERENCE TO RELATED APPLICATIONS

This application is a continuation of International Application No. PCT/CN2016/092994 filed on Aug. 3, 2016, which claims priority to Chinese patent application number 201610113602.7, filed on Feb. 29, 2016. The disclosures of the aforementioned applications are hereby incorporated by reference in their entireties.

TECHNICAL FIELD

Embodiments of the present invention relate to the semiconductor field, and more specifically, to an optical waveguide detector and an optical module.

BACKGROUND

Currently, a silicon photonics interconnect system mainly integrates a modulator, an optical waveguide detector, and some passive functional devices into a single chip. The modulator is configured to convert an electrical signal into an optical signal, so that an optical signal of a transmit end can be transmitted in an optical fiber. The optical waveguide detector is configured to convert an optical signal into an electrical signal, so that an optical signal of a receive end can undergo subsequent circuit processing. The optical waveguide detector configured to convert an optical signal into an electrical signal is a core device in the silicon photonics interconnect system.

Currently, a mainstream optical waveguide detector is a lateral PIN (LPIN) optical waveguide detector. The LPIN optical waveguide detector performs doping in a silicon waveguide, so that a PN junction is formed in the silicon waveguide. The PN junction is located below a germanium waveguide, and can generate an electric field in the germanium waveguide. Because germanium can absorb an optical signal, a photo-generated carrier is generated in the germanium waveguide under action of the electric field. In this way, the optical signal is converted into an electrical signal. However, electric field strength in the germanium waveguide of the current LPIN optical waveguide detector is relatively low. Therefore, a transmission rate of the photo-generated carrier in the electric field is relatively low, and a bandwidth of the LPIN optical waveguide detector is relatively low.

SUMMARY

This application provides an optical waveguide detector and an optical module to effectively increase a bandwidth of the optical waveguide detector.

According to a first aspect, an optical waveguide detector is provided and includes:

a waveguide layer, an upper cladding layer, and an electrode layer that are stacked in a first direction, where the upper cladding layer is located between the waveguide layer and the electrode layer;

the waveguide layer includes a silicon waveguide layer and a germanium waveguide layer, and the germanium waveguide layer is located between the silicon waveguide layer and the upper cladding layer;

the silicon waveguide layer includes a P-type heavily silicon-doped area, a P-type lightly silicon-doped area, an N-type lightly silicon-doped area, and an N-type heavily silicon-doped area that are arranged in a second direction, the P-type lightly silicon-doped area is located between the P-type heavily silicon-doped area and the N-type lightly silicon-doped area, the N-type lightly silicon-doped area is located between the P-type lightly silicon-doped area and the N-type heavily silicon-doped area, and the second direction is perpendicular to the first direction;

the germanium waveguide layer includes a first heavily germanium-doped area and a germanium-undoped area, a first surface of the germanium waveguide layer includes a surface of the first heavily germanium-doped area, the first surface is a surface of the germanium waveguide layer away from the silicon waveguide layer in the first direction, a width of the first heavily germanium-doped area is greater than 0 and less than or equal to half a width of the first surface, and a thickness of the first heavily germanium-doped area is greater than or equal to 5 nm and less than or equal to 200 nm; and a first metal through-hole is provided in the upper cladding layer, and the first metal through-hole connects the first heavily germanium-doped area to the electrode layer.

In this application, a heavily germanium-doped area is provided on a germanium waveguide, and this is equivalent to providing an electrode on the germanium waveguide. The electrode on the germanium waveguide and a counter electrode on a silicon waveguide may form a PN junction. This can enhance electric field strength in the germanium waveguide, increase a migration rate of photo-generated carriers, and further increase a bandwidth of the optical waveguide detector effectively.

With reference to the first aspect, in a first possible implementation of the first aspect, the first heavily germanium-doped area is a P-type heavily germanium-doped area, a distance between a central point of the first heavily germanium-doped area on the first surface and a first edge of the first surface is less than or equal to a distance between the central point and a second edge of the first surface, the first edge is an edge of the first surface close to the P-type heavily silicon-doped area in the second direction, and the second edge is an edge of the first surface close to the N-type heavily silicon-doped area in the second direction.

In this application, the P-type heavily germanium-doped area is provided in a position close to the P-type heavily silicon-doped area on the germanium waveguide. This can not only enhance the electric field strength in the germanium waveguide, but also make the electric field strength in the germanium waveguide relatively uniform, and therefore can effectively increase the migration rate of the photo-generated carriers, and increase the bandwidth of the optical waveguide detector.

With reference to the first possible implementation of the first aspect, in a second possible implementation of the first aspect, an edge of the first heavily germanium-doped area on the first surface and closest to the P-type heavily silicon-doped area in the second direction coincides with the first edge.

With reference to the first or the second possible implementation of the first aspect, in a third possible implementation of the first aspect, the upper cladding layer further includes a third metal through-hole, and the third metal through-hole connects the P-type heavily silicon-doped area to the electrode layer; and the electrode layer connected to the first metal through-hole and the electrode layer connected to the third metal through-hole have a same electrode polarity and a same voltage value.

With reference to the first aspect, in a fourth possible implementation of the first aspect, the first heavily germanium-doped area is an N-type heavily germanium-doped area, a distance between a central point of the first heavily germanium-doped area on the first surface and a first edge of the first surface is greater than or equal to a distance between the central point and a second edge of the first surface, the first edge is an edge of the first surface close to the P-type heavily silicon-doped area in the second direction, and the second edge is an edge of the first surface close to the N-type heavily silicon-doped area in the second direction.

In this application, the N-type heavily germanium-doped area is provided in a position close to the N-type heavily silicon-doped area on the germanium waveguide. This can not only enhance the electric field strength in the germanium waveguide, but also make the electric field strength in the germanium waveguide relatively uniform, and therefore can effectively increase the migration rate of the photo-generated carriers, and increase the bandwidth of the optical waveguide detector.

With reference to the fourth possible implementation of the first aspect, in a fifth possible implementation of the first aspect, an edge of the first heavily germanium-doped area on the first surface and closest to the N-type heavily silicon-doped area in the second direction coincides with the second edge.

With reference to the fourth or the fifth possible implementation of the first aspect, in a sixth possible implementation of the first aspect, the upper cladding layer further includes a fourth metal through-hole, and the fourth metal through-hole connects the N-type heavily silicon-doped area to the electrode layer; and the electrode layer connected to the first metal through-hole and the electrode layer connected to the fourth metal through-hole have a same electrode polarity and a same voltage value.

With reference to the first aspect, in a seventh possible implementation of the first aspect, the germanium waveguide layer further includes a second heavily germanium-doped area, the first surface further includes a surface of the second heavily germanium-doped area, a width of the second heavily germanium-doped area is greater than 0 and less than or equal to half the width of the first surface, and a thickness of the second heavily germanium-doped area is greater than or equal to 5 nm and less than or equal to 200 nm;

the first heavily germanium-doped area is a P-type heavily germanium-doped area, and the second heavily germanium-doped area is an N-type heavily germanium-doped area; and the upper cladding layer further includes a second metal through-hole, and the second metal through-hole connects the second heavily germanium-doped area to the electrode layer.

In this application, the P-type heavily germanium-doped area and the N-type heavily germanium-doped area are provided on the germanium waveguide. In other words, a P-type electrode and an N-type electrode are provided on the germanium waveguide. This can enhance the electric field strength in the germanium waveguide more effectively, further increase the migration rate of the photo-generated carriers, and further increase the bandwidth of the optical waveguide detector effectively.

With reference to the seventh possible implementation of the first aspect, in an eighth possible implementation of the first aspect, a distance between a central point of the first heavily germanium-doped area on the first surface and a first edge of the first surface is less than or equal to a distance between the central point of the first heavily germanium-doped area on the first surface and a second edge of the first surface;

a distance between a central point of the second heavily germanium-doped area on the first surface and the first edge of the first surface is greater than or equal to a distance between the central point of the second heavily germanium-doped area on the first surface and the second edge of the first surface; and the first edge is an edge of the first surface close to the P-type heavily silicon-doped area in the second direction, and the second edge is an edge of the first surface close to the N-type heavily silicon-doped area in the second direction.

In this application, the P-type heavily germanium-doped area is provided in a position close to the P-type heavily silicon-doped area on the germanium waveguide, and the N-type heavily germanium-doped area is provided in a position close to the N-type heavily silicon-doped area on the germanium waveguide. This enhances the electric field strength in the germanium waveguide, and also makes the electric field strength in the germanium waveguide relatively uniform, and therefore can effectively increase the migration rate of the photo-generated carriers, and increase the bandwidth of the optical waveguide detector.

With reference to the eighth possible implementation of the first aspect, in a ninth possible implementation of the first aspect, an edge of the first heavily germanium-doped area on the first surface and closest to the P-type heavily silicon-doped area in the second direction coincides with the first edge, and an edge of the second heavily germanium-doped area on the first surface and closest to the N-type heavily silicon-doped area in the second direction coincides with the second edge.

With reference to any one of the seventh to the ninth possible implementations of the first aspect, in a tenth possible implementation of the first aspect, a gap exists between the first heavily germanium-doped area and the second heavily germanium-doped area.

It should be understood that the first heavily germanium-doped area is not in contact with the second heavily germanium-doped area.

With reference to any one of the seventh to the tenth possible implementations of the first aspect, in an eleventh possible implementation of the first aspect, the upper cladding layer further includes a third metal through-hole and a fourth metal through-hole, the third metal through-hole connects the P-type heavily silicon-doped area to the electrode layer, and the fourth metal through-hole connects the N-type heavily silicon-doped area to the electrode layer; and the electrode layer connected to the first metal through-hole and the electrode layer connected to the third metal through-hole have a same electrode polarity and a same voltage value, and the electrode layer connected to the second metal through-hole and the electrode layer connected to the fourth metal through-hole have a same electrode polarity and a same voltage value.

With reference to any one of the first aspect, or the first to the eleventh possible implementations of the first aspect, in a twelfth possible implementation of the first aspect, a width of the germanium-undoped area is greater than or equal to 100 nm and less than or equal to 2 μm.

It should be understood that the width of the germanium-undoped area is a maximum length of the germanium-undoped area in the second direction. In other words, the width of the germanium-undoped area is consistent with a width of the germanium waveguide layer. That the width of the germanium waveguide layer is less than 2 μm can ensure that the germanium waveguide is a single-mode waveguide, and therefore can reduce a loss caused by mode conversion.

With reference to any one of the first aspect, or the first to the twelfth possible implementations of the first aspect, in a thirteenth possible implementation of the first aspect, the P-type lightly silicon-doped area is neighboring to the N-type lightly silicon-doped area.

It should be understood that neighboring borders of the P-type lightly silicon-doped area and the N-type lightly silicon-doped area may be in contact, or a gap may exist. When a gap exists between the neighboring borders of the P-type lightly silicon-doped area and the N-type lightly silicon-doped area, a width of the gap is less than the width of the germanium waveguide layer.

With reference to any one of the first aspect, or the first to the thirteenth possible implementations of the first aspect, in a fourteenth possible implementation of the first aspect, a minimum distance between the P-type heavily silicon-doped area and the germanium waveguide layer is greater than or equal to 100 nm and less than or equal to 3 μm; and a minimum distance between the N-type heavily silicon-doped area and the germanium waveguide layer is greater than or equal to 100 nm and less than or equal to 3 μm.

It should be understood that setting the distance between the P-type heavily silicon-doped area and the germanium waveguide layer and the distance between the N-type heavily silicon-doped area and the germanium waveguide layer within an appropriate range can reduce an optical loss caused by a heavily doped area in the silicon waveguide layer.

In each of the foregoing implementations, the width is a length in the second direction, and the thickness is a length in the first direction. For example, the width of the first heavily germanium-doped area is a length of the first heavily germanium-doped area in the second direction, and the thickness of the first heavily germanium-doped area is a length of the first heavily germanium-doped area in the first direction.

In each of the foregoing implementations, the germanium waveguide layer is located above neighboring positions of the P-type lightly silicon-doped area and the N-type lightly silicon-doped area.

In each of the foregoing implementations, thicknesses of the silicon waveguide layer and the germanium waveguide layer are both greater than 100 nm and less than 3 μm. This ensures that light can be limited within the waveguide layer, and that a size of the optical waveguide detector is not very great.

In each of the foregoing implementations, a doping density of a heavily doped area is greater than $1 \times 10^{19}$ cm$^{-3}$, and a typical doping density is $1 \times 10^{20}$ cm$^{-3}$; a doping density of a lightly doped area is less than $1 \times 10^{19}$ cm$^{-3}$, and a typical doping density is $1 \times 10^{18}$ cm$^{-3}$.

In each of the foregoing implementations, the waveguide layer is located between a lower cladding layer and the upper cladding layer, and refractive indices of materials of the upper cladding layer and the lower cladding layer are less than a refractive index of the waveguide layer, so that light is limited within the waveguide layer for transmission. Specifically, the lower cladding layer is a buried oxide layer made of a SiO$_2$ material.

In each of the foregoing implementations, a conventional process may be used to implement a connection between the metal through-hole and the heavily doped area.

Based on the foregoing technical solution, in this application, a heavily germanium-doped area is provided on the germanium waveguide, and this is equivalent to providing an electrode on the germanium waveguide. The electrode on the germanium waveguide and a counter electrode on the silicon waveguide may form a PN junction. This can enhance the electric field strength in the germanium waveguide, increase the migration rate of the photo-generated carriers, and further increase the bandwidth of the optical waveguide detector effectively.

According to a second aspect, an embodiment of the present invention provides an optical module, where the optical module includes a processing circuit and the optical waveguide detector according to any one of the first aspect, or the first possible implementation to the fourteenth possible implementation of the first aspect, the optical waveguide detector is configured to convert an optical signal into an electrical signal, and the processing circuit is configured to process the electrical signal obtained by the optical waveguide detector.

In this application, a heavily germanium-doped area is provided on a germanium waveguide, and this is equivalent to providing an electrode on the germanium waveguide. The electrode on the germanium waveguide and a counter electrode on a silicon waveguide may form a PN junction. This can enhance electric field strength in the germanium waveguide, and increase a migration rate of photo-generated carriers, and therefore can increase a bandwidth of the optical waveguide detector effectively, that is, improve efficiency of the optical waveguide detector in converting optical signals into electrical signals, and further improve efficiency of the optical module in processing the optical signals.

BRIEF DESCRIPTION OF DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Figure 1:
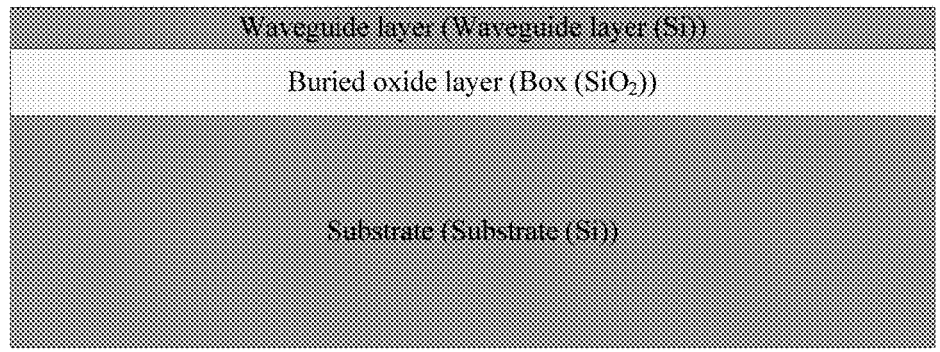
FIG. 1 is a schematic diagram of silicon-on-insulator SOI.

A silicon (Si) material, as a conventional material in the microelectronic field, has incomparable advantages over other materials in terms of processing techniques and production costs. Therefore, a silicon-based optoelectronic integration technology emerges. Currently, all silicon photonics interconnect devices implement silicon photonics integration based on a silicon-on-insulator (SOI) platform by using CMOS processes such as an ion injection, etching, deposition, and material growth. A structure of SOI is shown in FIG. 1. The SOI includes a silicon substrate, a buried oxide (Box) (its component is $SiO_2$) layer, and a silicon waveguide layer (also referred to as a Si waveguide layer) from bottom to top. A refractive index of $SiO_2$ is relatively small (approximately 1.44), but a refractive index of Si is very large (approximately 3.47). Therefore, a difference between the refractive indices in the SOI is very large, and light is limited very greatly. Therefore, a waveguide size of the SOI is very small. A typical waveguide size is 400 nm×220 nm.

Currently, a silicon photonics interconnect system mainly integrates a modulator, a detector, and some passive functional devices into a single chip. The modulator converts an electrical signal into an optical signal, so that an optical signal of a transmit end can be transmitted in an optical fiber. The detector (Photo Detector, PD) converts an optical signal into an electrical signal, so that an optical signal of a receive end can undergo subsequent circuit processing. It should be understood that the modulator is a part of a transmit end device, and that the detector is a part of a receive end device.

The detector configured to convert an optical signal into an electrical signal is a core device in the silicon photonics interconnect system. The detector is mainly implemented by using a germanium (Ge) material, and is also referred to as a Ge detector. Basic structures of the Ge detector are shown in FIG. 2. Mainly, a Ge material is grown on SOI (for example, produced by using a technology of silicon-based epitaxial growth of germanium), a thickness of the Ge material is controlled by changing a growth condition of the material, and a width of the Ge material is controlled by using an etching method, so that a Ge waveguide is grown on a Si waveguide. The Ge waveguide on SOI has a plurality of structures, including a conventional structure shown in FIG. 2(a), a stepwise structure shown in FIG. 2(b), an etched structure shown in FIG. 2(c), a composite structure shown in FIG. 2(d), or another structure, or the like.

At an indoor temperature (300K), Si can detect a long wavelength of up to 1.107 μm, and Ge can absorb a long wavelength of approximately up to 1.87 μm. Therefore, in infrared communication bands (mainly 1.31 μm, 1.490 μm, and 1.55 μm), Si is equivalent to a transparent material, and Ge may be used as a light-absorbing material to perform optical-to-electrical conversion. FIG. 3 shows light field distribution in the composite waveguide structure shown in FIG. 2(d). As can be seen, light field strength in a central position of the Ge waveguide is the highest, and light field strength is relatively low in edge positions of the Ge waveguide.

However, because a crystal lattice structure mismatch exists between germanium and silicon, a large quantity of crystal lattice defects exist in the Ge detector produced by using the technology of silicon-based epitaxial growth of germanium. In addition, because a dangling bond on a sidewall of the Ge waveguide causes a relatively high electric field strength at a Si/Ge interface, a relatively high dark current is generated. It should be understood that when there is no light in a photodiode, free carriers, namely, freely moving electrons and holes, are also generated due to a reason of hot electron emission or the like. Under action of an electric field, the free carriers may also generate a current. The current flowing in a circuit when there is no light is referred to as a dark current. If the dark current of the detector is higher, noise is greater, and a relatively weak optical signal cannot be demodulated. In addition, if the dark current is high, it indicates that heating of the detector is relatively severe and affects a service life of the detector.

Figure 4:
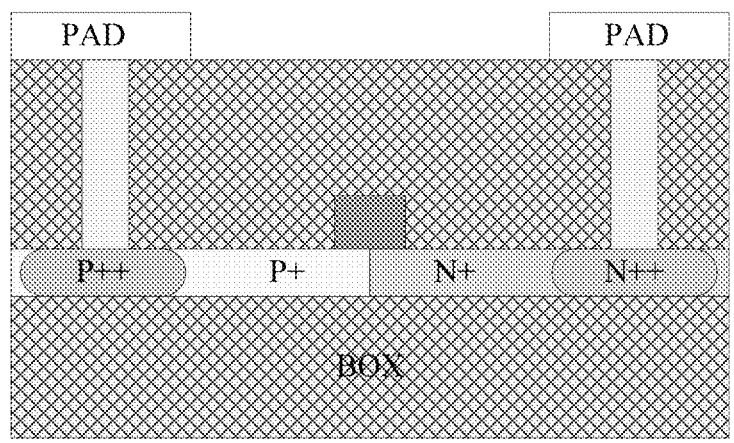
FIG. 4 is a schematic diagram of a structure of an LPIN optical waveguide detector in the prior art.
Figure 5:
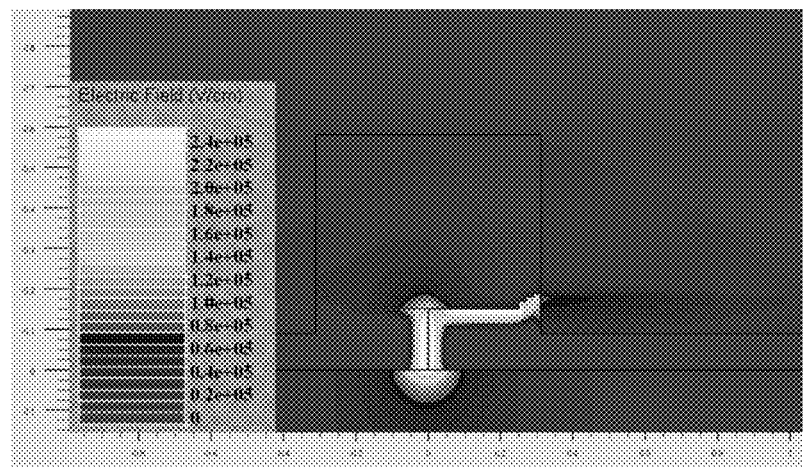
FIG. 5 is a schematic diagram of electric field distribution in the LPIN optical waveguide detector shown in FIG. 4.

With respect to the foregoing technical problem, currently, a mainstream optical waveguide detector (namely, a Ge detector) is a lateral PIN (LPIN) optical waveguide detector. A structure of the optical waveguide detector is shown in FIG. 4. Doping is performed in a Si waveguide layer of the optical waveguide detector. P++, P+, N++, and N+ are respectively a P-type heavily silicon-doped area, a P-type lightly silicon-doped area, an N-type heavily silicon-doped area, and an N-type lightly silicon-doped area. The heavily doped area is connected to a metal through-hole to ensure good ohmic contact. The lightly doped area is used to provide a carrier to ensure appropriate electric field distribution, so that a PN junction is implemented in a Si waveguide. The electric field distribution of the PN junction in the LPIN optical waveguide detector is shown in FIG. 5. From the figure, it can be seen that the electric field distribution at a Si/Ge interface covers only half the Si/Ge interface approximately. This reduces electric field strength at the Si/Ge interface to some extent, and therefore can reduce a dark current of the detector. However, electric field strength in a Ge waveguide of the LPIN optical waveguide detector is relatively low, and a transmission rate of photo-generated carriers in the electric field is relatively low. Therefore, given a same bias voltage, a bandwidth of the LPIN optical waveguide detector is relatively low, that is, the conventional LPIN optical waveguide detector limits the bandwidth of the waveguide detector. A requirement of a current high-speed optical communications and optical interconnect system is to implement a silicon-based germanium optoelectronic detector (namely, a Ge detector) that has a high bandwidth and a low dark current.

In view of the foregoing technical problem, an embodiment of the present invention provides a waveguide detector that can increase a bandwidth of the optical waveguide detector while reducing a dark current of the optical waveguide detector.

Figure 6:
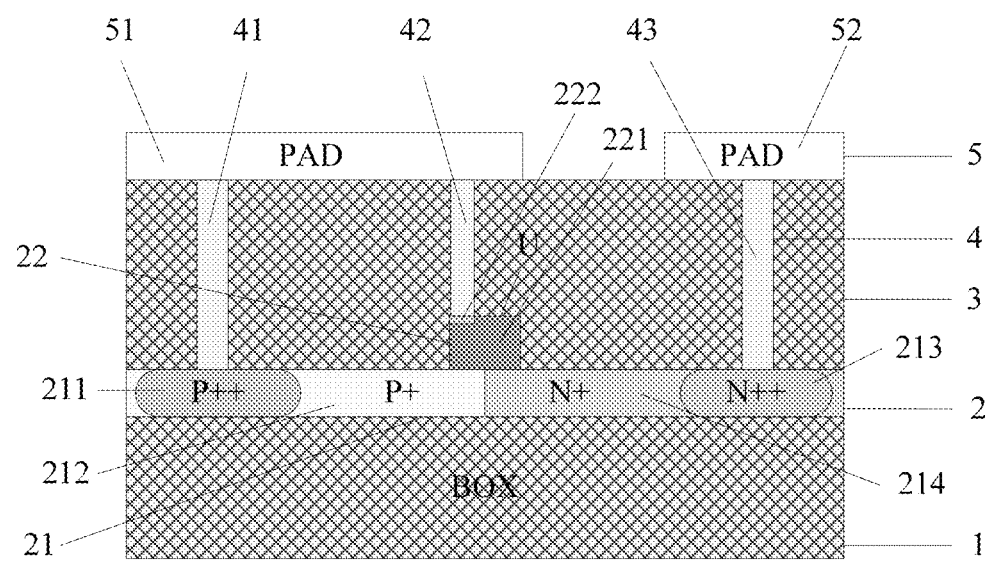
FIG. 6 is a schematic diagram of a structure of an optical waveguide detector according to an embodiment of the present invention.

FIG. 6 is a schematic diagram of a structure of a waveguide detector 100 according to an embodiment of the present invention. The waveguide detector 100 includes a lower cladding layer 1, a waveguide layer 2, an upper cladding layer 3, and an electrode layer 5 (a pad as shown in FIG. 6). The upper cladding layer 3 includes a metal through-hole 4. The metal through-hole 4 is used to implement an electrical connection between the electrode layer 5 and the waveguide layer 2.

The waveguide layer 2 includes a Si waveguide layer 21 and a Ge waveguide layer 22. The Ge waveguide layer 22 is located between the upper cladding layer 3 and the Si waveguide layer 21. Specifically, a width of the Ge waveguide layer 22 is greater than or equal to 100 nm and less than or equal to 2 μm. A width of the Si waveguide layer 21 is generally equal to widths of the upper cladding layer 3 and the lower cladding layer 2. For example, the width of the Si waveguide layer 21 is 400 nm.

The Ge waveguide layer 22 includes a Ge-undoped area 221 and a heavily Ge-doped area 222. It should be understood that the Ge-undoped area 221 absorbs an optical signal and converts the optical signal into an electrical signal. A first surface of the Ge waveguide layer 22 (a surface U of the Ge waveguide layer 22 away from the Si waveguide layer 21 in the first direction as shown in FIG. 6) includes a surface of the heavily Ge-doped area 222, and a width of the heavily Ge-doped area 222 is greater than 0 and less than half a width of the first surface of the Ge waveguide layer 22. The heavily Ge-doped area 222 is connected to a pad 51 by a metal through-hole 42, so that the heavily Ge-doped area 222 is connected to a power source (the power source is not drawn in FIG. 6).

The Si waveguide layer 21 includes a P-type heavily silicon-doped area 211 (P++ on a Si waveguide as shown in FIG. 6), a P-type lightly silicon-doped area 212 (P+ on the Si waveguide as shown in FIG. 6), an N-type lightly silicon-doped area 214 (N+ on the Si waveguide as shown in FIG. 6), and an N-type heavily silicon-doped area 213 ((N++ on the Si waveguide as shown in FIG. 6) that are arranged in a second direction. As shown in FIG. 6, neighboring borders of the P-type lightly silicon-doped area and the N-type lightly silicon-doped area are located below the germanium waveguide layer. The P-type lightly silicon-doped area 212 is located between the P-type heavily silicon-doped area 211 and the N-type lightly silicon-doped area 214. The N-type lightly silicon-doped area 214 is located between the P-type lightly silicon-doped area 212 and the N-type heavily silicon-doped area 213. The P-type heavily silicon-doped area 211 is connected to the pad 51 by a metal through-hole 41, and the N-type heavily silicon-doped area 213 is connected to a pad 52 by a metal through-hole 43, so that the P-type heavily silicon-doped area 211 and the N-type heavily silicon-doped area 213 are connected to the power source. It should be understood that the P-type heavily silicon-doped area 211 and the N-type heavily silicon-doped area 213 are connected to two electrodes of the power source.

Optionally, in this embodiment of the present invention, the heavily Ge-doped area 222 may be a P-type heavily doped area, or may be an N-type heavily doped area.

Figure 7:
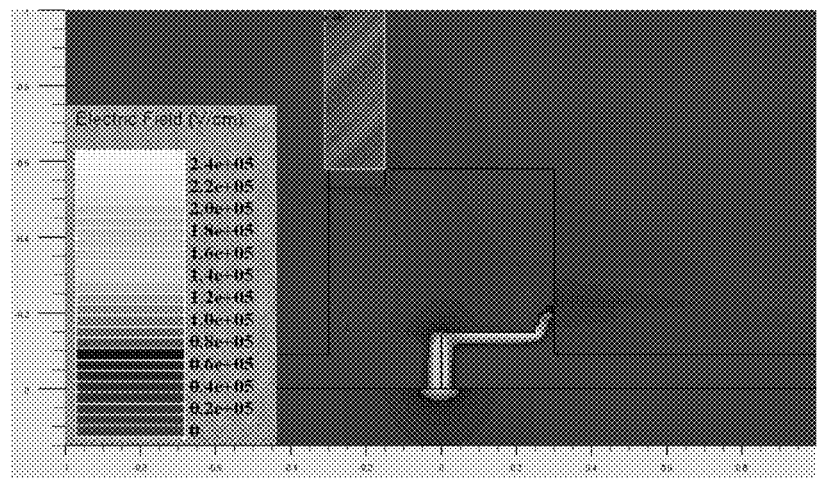
FIG. 7 is a schematic diagram of electric field distribution in an optical waveguide detector according to an embodiment of the present invention.

It should be understood that when the heavily Ge-doped area 222 is a P-type heavily doped area, this is equivalent to a P-type electrode existing in the Ge waveguide layer. The N-type heavily silicon-doped area 213 in the Si waveguide layer is equivalent to an N-type electrode. In the structure shown in FIG. 6, after the electrode layer 5 is connected to the power source, a PN junction is formed between the P-type electrode and the N-type electrode. In this case, an electric field is formed in the Ge waveguide layer 22, as shown in FIG. 7. Similarly, when the heavily Ge-doped area 222 is an N-type heavily doped area, this is equivalent to an N-type electrode existing in the Ge waveguide layer. The P-type heavily silicon-doped area 211 in the Si waveguide layer is equivalent to a P-type electrode. In the structure shown in FIG. 6, after the electrode layer 5 is connected to the power source, a PN junction is formed between the P-type electrode and the N-type electrode. In this case, an electric field is also formed in the Ge waveguide layer 22. It should be understood that, compared with a conventional LPIN waveguide detector, this embodiment of the present invention can enhance electric field strength in a Ge waveguide effectively, and therefore increase a migration rate of photo-generated carriers, and further increase a bandwidth of the optical waveguide detector effectively. It should be understood that because the bandwidth of the detector is increased, efficiency of the detector in converting optical signals into electrical signals can be improved.

In addition, from FIG. 7, it can be seen that electric field distribution at a Si/Ge interface covers only half the Si/Ge interface approximately. This reduces electric field strength at the Si/Ge interface to some extent, and therefore can reduce a dark current of the detector.

Therefore, compared with the conventional LPIN waveguide detector, this embodiment of the present invention can effectively increase the bandwidth of the optical waveguide detector while maintaining a relatively low dark current. That is, two performance indicators of the detector, namely, the dark current and the bandwidth, can both be considered. Therefore, a basic requirement of a current high-speed optical communications system is met.

The second direction in this embodiment of the present invention is perpendicular to the first direction. Assuming that the first direction is a vertical direction, the second direction is a horizontal direction.

It should be understood that the lower cladding layer 1 is, for example, the buried oxide layer shown in FIG. 1. A refractive index of a material of the upper cladding layer 3 is less than a refractive index of the waveguide layer 2, and a refractive index of a material of the buried oxide layer 1 is less than the refractive index of the waveguide layer 2, so that light is limited within the waveguide layer 2 for transmission. It should also be understood that the lower cladding layer 1 is located on a substrate (not shown in FIG. 6, corresponding to the substrate shown in FIG. 1).

In this embodiment of the present invention, thicknesses of the Si waveguide layer 21 and the Ge waveguide layer 22 are greater than 100 nm and less than 3 μm. This ensures that light can be limited within the waveguide layer 2, and that a device size is not very great.

In this embodiment of the present invention, that the width of the Ge waveguide layer 22 is less than 2 μm ensures that what is transmitted in the Ge waveguide is a single-mode waveguide, and therefore can reduce a loss caused by mode conversion.

In this embodiment of the present invention, a minimum distance between the P-type heavily silicon-doped area 211 and the Ge waveguide layer 22 is greater than or equal to 100 nm and less than or equal to 3 μm; and a minimum distance between the N-type heavily silicon-doped area 213 and the Ge waveguide layer 22 is greater than or equal to 100 nm and less than or equal to 3 μm. This ensures that an optical loss caused by a heavily doped area is relatively small, and that the electric field can be effectively loaded to the PN junction. Therefore, a high bandwidth of the device is ensured.

In this embodiment of the present invention, a border of the P-type lightly Si-doped area 212 close to the N-type lightly Si-doped area 214 and a border of the N-type lightly Si-doped area 214 close to the P-type lightly Si-doped area 212 are both located below the Ge waveguide layer 22.

Optionally, in this embodiment of the present invention, the P-type lightly Si-doped area 212 and the N-type lightly Si-doped area 214 are in contact. For details, refer to FIG. 6.

Optionally, in this embodiment of the present invention, a gap (GAP) exists between the neighboring borders of the P-type lightly Si-doped area 212 and the N-type lightly Si-doped area 214, and a width of the gap is less than the width of the Ge waveguide layer 22.

In this embodiment of the present invention, when ions injected into the heavily Ge-doped area 222 and the P-type heavily silicon-doped area 211 are the same, the heavily Ge-doped area 222 is located in an edge position on the first surface U of the Ge-undoped area 221 close to the P-type heavily silicon-doped area 211. When ions injected into the heavily Ge-doped area 222 and the N-type heavily doped area 213 are the same, the heavily Ge-doped area 222 is located in an edge position on the first surface U of the Ge-undoped area 221 close to the N-type heavily doped area 213.

Optionally, in this embodiment of the present invention, the heavily Ge-doped area 222 in the Ge waveguide layer 22 is a P-type heavily doped area, a distance between a central point of the heavily Ge-doped area 222 on the first surface U and a first edge of the first surface U is less than or equal to a distance between the central point and a second edge of the first surface U, the first edge is an edge of the first surface U close to the P-type heavily silicon-doped area 211 in the second direction, and the second edge is an edge of the first surface U close to the N-type heavily silicon-doped area 213 in the second direction.

Optionally, in this embodiment of the present invention, an edge of the heavily germanium-doped area 222 on the first surface U and closest to the P-type heavily silicon-doped area 211 in the second direction coincides with the first edge.

Specifically, as shown in FIG. 6, the P-type heavily Ge-doped area 222 is located at a left edge of the Ge waveguide layer 22. Correspondingly, as shown in FIG. 7, a direction of electric field strength in the Ge-undoped area 221 is a direction from an upper left edge to a lower right edge of the Ge-undoped waveguide 221.

Specifically, FIG. 7 shows electric field distribution in the structure shown in FIG. 6. By comparing the electric field distribution in FIG. 7 with that in FIG. 5, it can be seen that electric field strength in the Ge waveguide in this embodiment of the present invention is relatively high. Therefore, a transmission rate of photo-generated carriers in the electric field can be increased, and the bandwidth of the detector may be further increased.

It should be understood that a migration rate of carriers (electrons or holes) is an average migration rate of carriers under action of a unit electric field strength, and is an inherent attribute determined by the structure and material of the device. When the migration rate of the carriers is determined, if the electric field strength is increased, the migration rate of the carriers can be increased. If a relatively strong electric field is formed in the Ge waveguide, a migration rate of photo-generated carriers (the photo-generated carriers are carriers caused by light intensity) in the Ge waveguide can be increased effectively. Increasing the migration rate of the photo-generated carriers can decrease a transition time taken by the photo-generated carriers to travel between two electrode collection areas, and therefore can increase the bandwidth of the detector.

Optionally, in this embodiment of the present invention, the electrode layer connected to the metal through-hole 42 of the P-type heavily Ge-doped area 222 and the electrode layer connected to the metal through-hole 41 of the P-type heavily silicon-doped area 211 have a same electrode polarity and a same voltage value.

Specifically, as shown in FIG. 6, the metal through-hole 42 of the P-type heavily Ge-doped area 222 and the metal through-hole 41 of the P-type heavily silicon-doped area 211 may share the pad 51.

Optionally, in this embodiment of the present invention, the heavily Ge-doped area 222 in the Ge waveguide layer 22 is an N-type heavily doped area, a distance between a central point of the heavily Ge-doped area 222 on the first surface U and a first edge of the first surface U is greater than or equal to a distance between the central point and a second edge of the first surface U, the first edge is an edge of the first surface close to the P-type heavily silicon-doped area in the second direction, and the second edge is an edge of the first surface close to the N-type heavily silicon-doped area in the second direction.

Optionally, in this embodiment of the present invention, an edge of the heavily germanium-doped area 222 on the first surface U and closest to the N-type heavily silicon-doped area 213 in the second direction coincides with the second edge.

Figure 8:
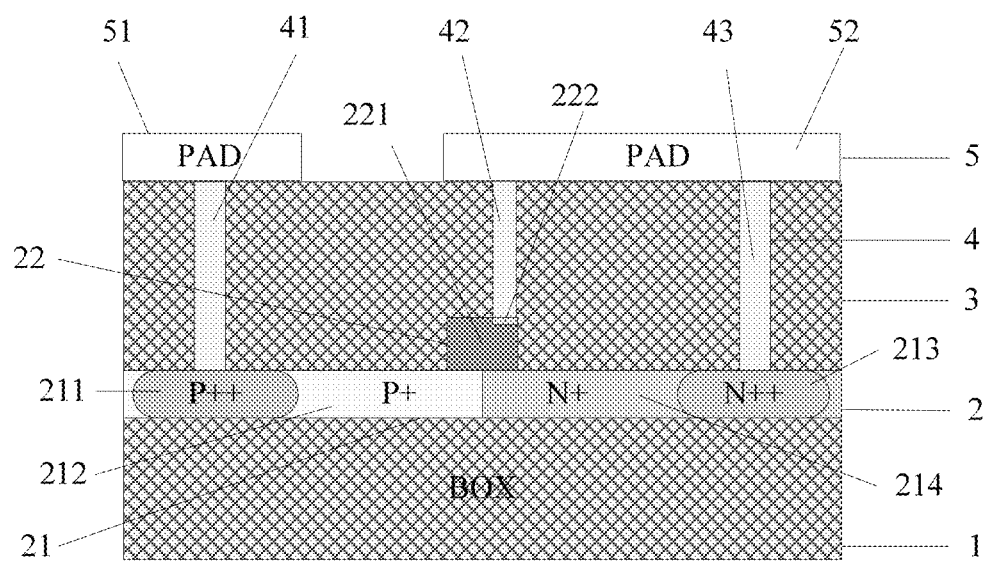
FIG. 8 is a schematic diagram of a structure of an optical waveguide detector according to another embodiment of the present invention.

Specifically, as shown in FIG. 8, the N-type heavily Ge-doped area 222 is located at a right edge of the Ge waveguide layer 22. Correspondingly, a direction of electric field strength in the Ge-undoped area 221 is a direction from an upper right edge to a lower left edge of the Ge-undoped waveguide 221.

It should be understood that electric field distribution (not shown) of the waveguide detector shown in FIG. 8 is similar to the electric field distribution shown in FIG. 7. Compared with the conventional LPIN structure, this embodiment of the present invention can effectively enhance electric field strength in the Ge waveguide, increase the transmission rate of the photo-generated carriers in the electric field, and further increase the bandwidth of the detector.

From the electric field distribution in the structure of the waveguide detector shown in FIG. 7, it can also be seen that the electric field distribution at the Si/Ge interface covers only half the Si/Ge interface approximately. This reduces electric field strength at the Si/Ge interface to some extent, and therefore can reduce the dark current of the detector.

Therefore, in this embodiment of the present invention, a heavily germanium-doped area is provided on the germanium waveguide, and this is equivalent to providing an electrode on the germanium waveguide. The electrode on the germanium waveguide and a counter electrode on the silicon waveguide may form a PN junction. This can enhance the electric field strength in the germanium waveguide, increase the migration rate of the photo-generated carriers, and further increase the bandwidth of the optical waveguide detector effectively. Therefore, compared with the conventional LPIN waveguide detector, this application can effectively increase the bandwidth of the optical waveguide detector while maintaining a relatively low dark current. The two performance indicators of the detector, namely, the dark current and the bandwidth, can both be considered. Therefore, a basic requirement of a current high-speed optical communications and optical interconnect system can be met.

Optionally, in this embodiment of the present invention, the electrode layer connected to the metal through-hole 42 of the N-type heavily Ge-doped area 222 and the electrode layer connected to the metal through-hole 43 of the N-type heavily silicon-doped area 213 have a same electrode polarity and a same voltage value.

Specifically, as shown in FIG. 8, the metal through-hole 42 of the N-type heavily Ge-doped area 222 and the metal through-hole 43 of the N-type heavily silicon-doped area 213 may share the pad 52.

Figure 2A:
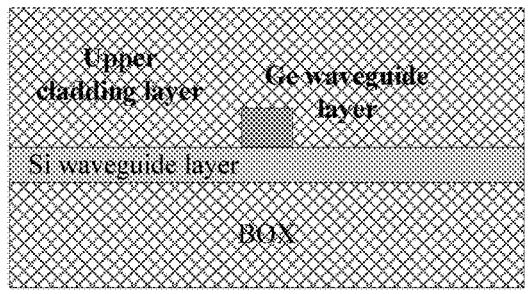
FIG. 2(a) to FIG. 2(d) are schematic diagrams of basic structures of an optical waveguide detector in the prior art.
Figure 2B:
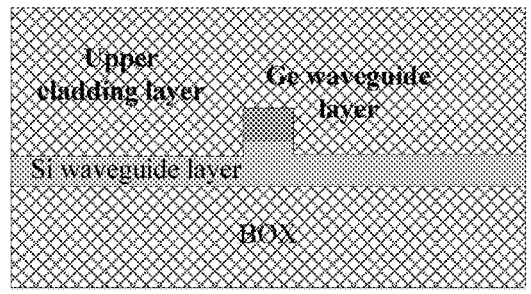
Figure 2C:
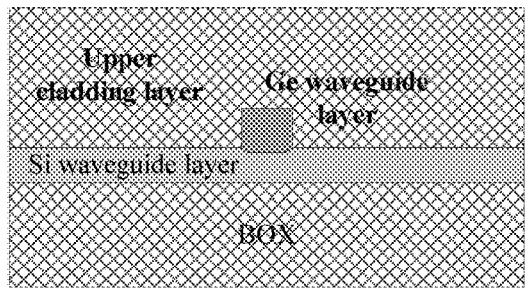
Figure 2D:
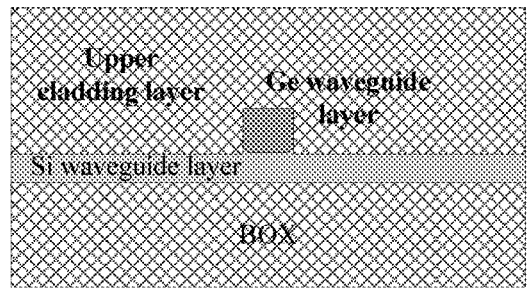
Figure 3:
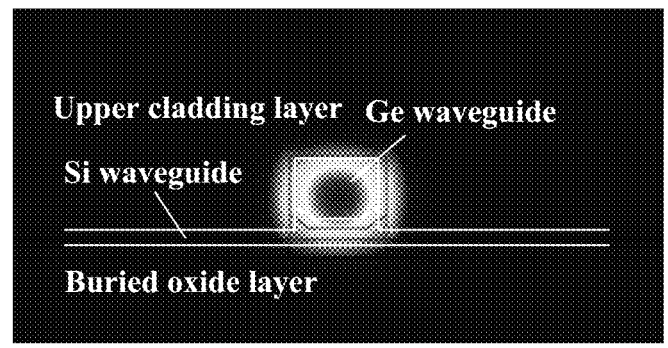
FIG. 3 is a schematic diagram of light field distribution in a waveguide structure shown in FIG. 2(d)

From the light field distribution in the composite waveguide structure shown in FIG. 2(d) as shown in FIG. 3, it can be seen that the light field strength in the central position of the Ge waveguide is the highest, and the light field strength is relatively low in the edge positions of the Ge waveguide. Therefore, in this embodiment of the present invention, the heavily Ge-doped area 222 is provided in an edge position of the Ge waveguide layer 22. This can reduce interaction between the light field and a highly doped material in the Ge waveguide, and can further reduce a light absorption loss of the Ge waveguide.

It should be understood that in this embodiment of the present invention, when the heavily Ge-doped area 222 in the Ge waveguide layer 22 is a P-type heavily doped area, the metal through-hole 42 of the heavily Ge-doped area 222 and the metal through-hole 41 of the P-type heavily silicon-doped area 211 in the Si waveguide layer may share the pad 51, as shown in FIG. 6. When the heavily Ge-doped area 222 in the Ge waveguide layer 22 is an N-type heavily doped area, the metal through-hole 42 of the heavily Ge-doped area 222 and the metal through-hole 43 of the N-type heavily silicon-doped area 213 in the Si waveguide layer may share the pad 52 (as shown in FIG. 8). It should be understood that the metal through-hole 42 of the heavily Ge-doped area 222 may also be connected to an independent pad. This is not limited in this embodiment of the present invention.

The waveguide detector structure shown in FIG. 6 may be referred to as a P-type single-sided bipolar detector structure, and the waveguide detector structure shown in FIG. 8 may be referred to as an N-type single-sided bipolar detector structure.

Figure 9:
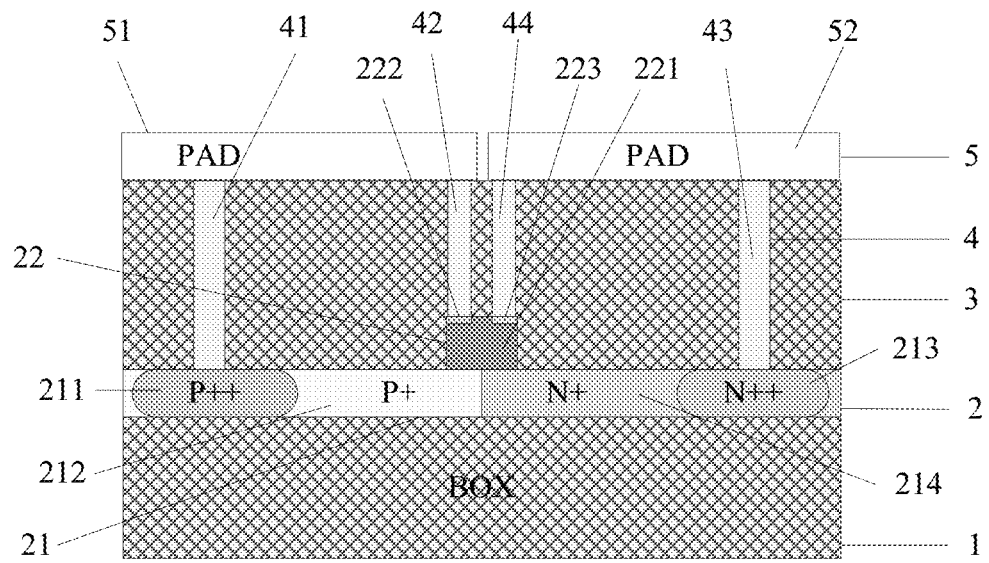
FIG. 9 is a schematic diagram of a structure of an optical waveguide detector according to still another embodiment of the present invention.

FIG. 9 is a schematic diagram of another structure of a waveguide detector according to an embodiment of the present invention. The structure differs from the structures of the waveguide detectors shown in FIG. 6 and FIG. 8 in that a Ge waveguide layer 22 includes two heavily Ge-doped areas, namely, a heavily Ge-doped area 222 and a heavily Ge-doped area 223. A first surface U of the Ge waveguide layer 22 includes a surface of the heavily Ge-doped area 222 and a surface of the heavily Ge-doped area 223. Widths of the heavily Ge-doped area 222 and the heavily Ge-doped area 223 are greater than 0 and less than or equal to half a width of the first surface U. Thicknesses of the heavily Ge-doped area 222 and the heavily Ge-doped area 223 are greater than or equal to 5 nm and less than or equal to 200 nm. The heavily Ge-doped area 222 is connected to a pad 51 by a metal through-hole 42, and the N-type heavily doped area 223 is connected to a pad 52 by a metal through-hole 44.

In this embodiment of the present invention, ions injected into the heavily doped area 222 (namely, the P-type heavily Ge-doped area 222) and a P-type heavily silicon-doped area 211 are the same, and the heavily doped area 222 is located at an edge of the Ge waveguide layer 22 close to the P-type heavily silicon-doped area 211. Ions injected into the heavily doped area 223 (namely, the N-type heavily doped area 223) and an N-type heavily silicon-doped area 213 are the same, and the heavily doped area 223 is located at an edge of the Ge waveguide layer 22 close to the N-type heavily silicon-doped area 213.

Optionally, in this embodiment of the present invention, a distance between a central point of the P-type heavily Ge-doped area 222 on the first surface U and a first edge of the first surface U is less than or equal to a distance between the central point of the P-type heavily Ge-doped area 222 on the first surface U and a second edge of the first surface U;

a distance between a central point of the N-type heavily doped area 223 on the first surface U and the first edge of the first surface U is greater than or equal to a distance between the central point of the N-type heavily doped area 223 on the first surface U and the second edge of the first surface; and the first edge is an edge of the first surface U close to the P-type heavily silicon-doped area 211 in the second direction, and the second edge is an edge of the first surface U close to the N-type heavily silicon-doped area 213 in the second direction.

Optionally, in this embodiment of the present invention, an edge of the P-type heavily Ge-doped area 222 on the first surface U and closest to the P-type heavily silicon-doped area in the second direction coincides with the first edge; and an edge of the N-type heavily doped area 223 on the first surface U and closest to the N-type heavily silicon-doped area in the second direction coincides with the second edge.

Specifically, as shown in FIG. 9, the P-type heavily Ge-doped area 222 is located at an upper left edge of the Ge waveguide layer 22, and the N-type heavily doped area 223 is located at an upper right edge of the Ge waveguide layer 22.

The waveguide detector structure shown in FIG. 9 may be referred to as a double-sided bipolar detector structure.

Figure 10:
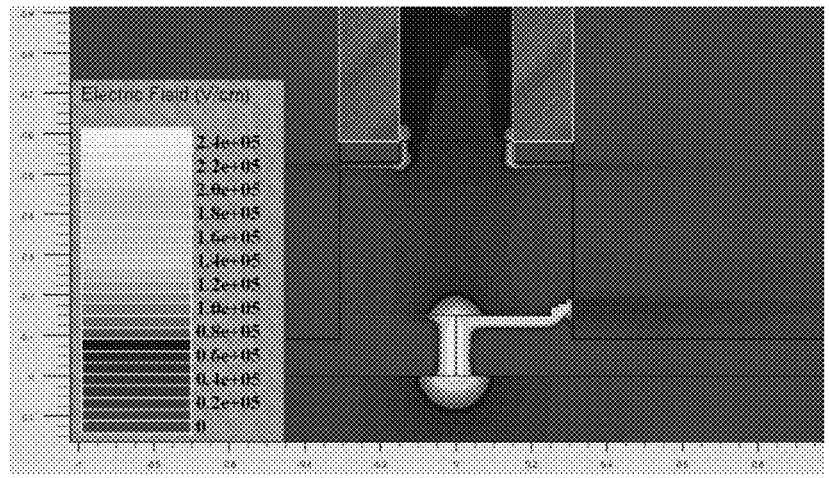
FIG. 10 is a schematic diagram of electric field distribution in the optical waveguide detector shown in FIG. 9.

FIG. 10 is a schematic diagram of electric field distribution in the double-sided bipolar detector structure shown in FIG. 9. By comparing FIG. 10 with FIG. 7, it can be seen that electric field strength in a Ge waveguide of the double-sided bipolar detector structure shown in FIG. 9 is higher, and distribution is relatively uniform. Therefore, a migration rate of photo-generated carriers can be increased more effectively, and a bandwidth of the waveguide detector is further increased. In addition, from FIG. 10, it can be seen that electric field distribution at a Si/Ge interface covers only half the Si/Ge interface approximately. This reduces electric field strength at the Si/Ge interface to some extent, and therefore can reduce a dark current of the detector.

Therefore, in this embodiment of the present invention, the P-type heavily germanium-doped area and the N-type heavily germanium-doped area are provided on the germanium waveguide, and this is equivalent to providing a P-type electrode and an N-type electrode on the germanium waveguide. This can enhance the electric field strength in the germanium waveguide more effectively, also make electric field distribution in the Ge waveguide relatively uniform, further increase the migration rate of the photo-generated carriers, and further increase the bandwidth of the optical waveguide detector effectively.

Optionally, in this embodiment of the present invention, an electrode layer connected to the metal through-hole 42 of the P-type heavily Ge-doped area 222 and an electrode layer connected to a metal through-hole 41 of the P-type heavily silicon-doped area 211 have a same electrode polarity and a same voltage value; and an electrode layer connected to the metal through-hole 44 of the N-type heavily doped area 223 and an electrode layer connected to a metal through-hole 43 of the N-type heavily silicon-doped area 213 have a same electrode polarity and a same voltage value.

Specifically, as shown in FIG. 9, the metal through-hole 42 of the P-type heavily Ge-doped area 222 and the metal through-hole 41 of the P-type heavily silicon-doped area 211 may share the pad 51; and the metal through-hole 44 of the N-type heavily doped area 223 and the metal through-hole 43 of the N-type heavily silicon-doped area 213 may share the pad 52. It should be understood that each metal through-hole in FIG. 9 may correspond to an independent pad. This is not limited in this embodiment of the present invention.

Therefore, in this embodiment of the present invention, a heavily germanium-doped area is provided on the germanium waveguide, and this is equivalent to providing an electrode on the germanium waveguide. The electrode on the germanium waveguide and a counter electrode on a silicon waveguide may form a PN junction. This can enhance the electric field strength in the germanium waveguide, increase the migration rate of the photo-generated carriers, and further increase the bandwidth of the optical waveguide detector effectively. In addition, in this embodiment of the present invention, the electric field strength at the Si/Ge heterogeneous interface of the waveguide detector is relatively low, and therefore the dark current of the waveguide detector is relatively low. Therefore, compared with a conventional LPIN waveguide detector, this application can effectively increase the bandwidth of the optical waveguide detector while maintaining a relatively low dark current. Two performance indicators of the detector, namely, the dark current and the bandwidth, can both be considered. Therefore, a basic requirement of a current high-speed optical communications and optical interconnect system can be met.

Optionally, in this embodiment of the present invention, a gap exists between the P-type heavily germanium-doped area 222 and the N-type heavily germanium-doped area 223. Specifically, as shown in FIG. 9, the P-type heavily germanium-doped area 222 is not in contact with the N-type heavily germanium-doped area 223. Correspondingly, a gap also exists between the metal through-holes 42 and 44, and the gap is not greater than a width of the Ge waveguide layer 22.

It should be understood that in this embodiment of the present invention, the P-type heavily germanium-doped area 222 may also be in contact with the N-type heavily germanium-doped area 223, that is, the gap shown in FIG. 9 does not exist between the P-type heavily germanium-doped area 222 and the N-type heavily germanium-doped area 223. This is not limited in this embodiment of the present invention.

It should also be understood that, the heavily doped areas 211 and 213 are used to reduce contact resistance between the metal through-holes 41 and 43 and a Si waveguide layer 21; the heavily Ge-doped area 222 is used to reduce contact resistance between the metal through-hole 42 and the Ge waveguide layer 22; and lightly doped areas 212 and 214 are used to provide a carrier transmission channel to ensure appropriate electric field distribution.

Optionally, in this embodiment of the present invention, the Si waveguide layer 21 includes the P-type heavily silicon-doped area 211 (P++), the P-type lightly silicon-doped area 212 (P+), the N-type lightly silicon-doped area 214 (N+), and the N-type heavily silicon-doped area 213 (N++) in sequence from left to right, as shown in FIG. 6.

Optionally, in this embodiment of the present invention, the Si waveguide layer 21 includes the N-type heavily silicon-doped area 213 (N++), the N-type lightly silicon-doped area 214 (N+), the P-type lightly silicon-doped area 212 (P+), and the P-type heavily silicon-doped area 211 (P++) in sequence from left to right.

It should be understood that in this embodiment of the present invention, a buried oxide layer 1 is made of a $SiO_2$ material, and a refractive index of a material of an upper cladding layer 3 is less than a refractive index of silicon. For example, the material of the upper cladding layer 3 is silicon nitride, or the like. This is not limited in this embodiment of the present invention.

In this embodiment of the present invention, doping densities of the heavily doped areas 211, 213, and 222 are greater than $1 \times 10^{19}$ $cm^{-3}$, and a typical doping density is $1 \times 10^{20}$ $cm^{-3}$; doping densities of the lightly doped areas 212 and 214 are less than $1 \times 10^{19}$ $cm^{-3}$, and a typical doping density is $1 \times 10^{18}$ $cm^{-3}$.

It should also be understood that the pad (PAD) shown in FIG. 6 is a part that supplies power to the metal through-hole. Because the metal through-hole is very small, a size of the pad can be increased to improve efficiency of charging the metal through-hole.

It should also be understood that in this embodiment of the present invention, in comparison with the waveguide detector of the conventional LPIN structure, in the single-sided bipolar detector structures shown in FIG. 6 and FIG. 8 and the double-sided bipolar waveguide detector structure shown in FIG. 9, an ion injection is required in the Ge waveguide (FIG. 6 and FIG. 8 correspond to one ion injection, and FIG. 9 corresponds to two ion injections). Although an additional process is required, the ion injection process is relatively mature and not difficult, and therefore is easy to implement. More importantly, compared with the conventional waveguide detector, the waveguide detector provided by this embodiment of the present invention has a relatively large performance improvement, that is, the bandwidth of the waveguide detector can be increased while a low dark current is ensured, and the requirement of the current high-speed optical communications and optical interconnect system can be met well. In addition, disposing an electrode (namely, a heavily doped area) at the edge of the Ge waveguide can reduce a light absorption loss caused by the heavily doped area.

It should also be understood that FIG. 6, FIG. 8, and FIG. 9 are schematic diagrams of cross-sections of the optical waveguide detectors provided by the embodiments of the present invention. The examples shown in FIG. 6, FIG. 8, and FIG. 9 are intended to help a person skilled in the art better understand the embodiments of the present invention, instead of limiting the present invention to the specific forms. Obviously, a person skilled in the art can make various equivalent modifications and variations to the examples provided in FIG. 6, FIG. 8, and FIG. 9. Such modifications and variations shall also fall within the scope of the embodiments of the present invention.

The optical waveguide detector in the embodiments of the present invention is a Ge detector that may be monolithically integrated in a silicon photonics interconnect system. The waveguide detector provided by the embodiments of the present invention may be applied to the field of silicon photonics integrated optoelectronic devices or separate optical devices.

Figure 11:
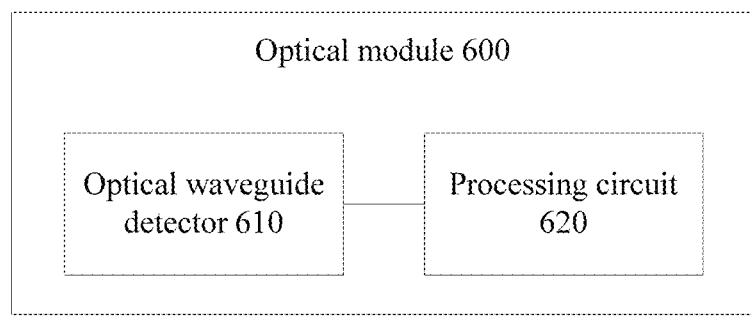
FIG. 11 is a schematic block diagram of an optical module according to an embodiment of the present invention.

FIG. 11 shows an optical module 600 according to an embodiment of the present invention. The optical module 600 includes an optical waveguide detector 610 and a processing circuit 620. The optical waveguide detector 610 is the optical waveguide detector described in each of the foregoing embodiments of the present invention. The optical waveguide detector 610 is configured to convert an optical signal into an electrical signal. The processing circuit 620 is configured to process the electrical signal that is obtained by the optical waveguide detector 610 by converting the optical signal.

In this embodiment of the present invention, a heavily germanium-doped area is provided on a germanium waveguide, and this is equivalent to providing an electrode on the germanium waveguide. The electrode on the germanium waveguide and a counter electrode on a silicon waveguide may form a PN junction. This can enhance electric field strength in the germanium waveguide, and increase a migration rate of photo-generated carriers, and therefore can increase a bandwidth of the optical waveguide detector effectively, that is, improve efficiency of the optical waveguide detector in converting optical signals into electrical signals, and further improve efficiency of the optical module in processing the optical signals.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An optical waveguide detector, comprising:
    a waveguide layer, an upper cladding layer, and an electrode layer that are stacked in a first direction, wherein the upper cladding layer is located between the waveguide layer and the electrode layer;
    wherein the waveguide layer comprises a silicon waveguide layer and a germanium waveguide layer, and the germanium waveguide layer is located between the silicon waveguide layer and the upper cladding layer;
    wherein the silicon waveguide layer comprises a P-type heavily silicon-doped area, a P-type lightly silicon-doped area, an N-type lightly silicon-doped area, and an N-type heavily silicon-doped area that are arranged in a second direction, the P-type lightly silicon-doped area is located between the P-type heavily silicon-doped area and the N-type lightly silicon-doped area, the N-type lightly silicon-doped area is located between the P-type lightly silicon-doped area and the N-type heavily silicon-doped area, and the second direction is perpendicular to the first direction;
    wherein the germanium waveguide layer comprises a first heavily germanium-doped area and a germanium-undoped area, a first surface of the germanium waveguide layer comprises a surface of the first heavily germanium-doped area, the first surface is a surface of the germanium waveguide layer away from the silicon waveguide layer in the first direction, a width of the first heavily germanium-doped area is greater than 0 and less than or equal to half a width of the first surface, and a thickness of the first heavily germanium-doped area is greater than or equal to 5 nm and less than or equal to 200 nm; and
    wherein the upper cladding layer comprises a first metal through-hole, and the first metal through-hole connects the first heavily germanium-doped area to the electrode layer.

2. The optical waveguide detector according to claim 1, wherein the first heavily germanium-doped area is a P-type heavily germanium-doped area, a distance between a central point of the first heavily germanium-doped area on the first surface and a first edge of the first surface is less than or equal to a distance between the central point and a second edge of the first surface, the first edge is an edge of the first surface close to the P-type heavily silicon-doped area in the second direction, and the second edge is an edge of the first surface close to the N-type heavily silicon-doped area in the second direction.

3. The optical waveguide detector according to claim 2, wherein an edge of the first heavily germanium-doped area on the first surface and closest to the P-type heavily silicon-doped area in the second direction coincides with the first edge.

4. The optical waveguide detector according to claim 1, wherein the first heavily germanium-doped area is an N-type heavily germanium-doped area, a distance between a central point of the first heavily germanium-doped area on the first surface and a first edge of the first surface is greater than or equal to a distance between the central point and a second edge of the first surface, the first edge is an edge of the first surface close to the P-type heavily silicon-doped area in the second direction, and the second edge is an edge of the first surface close to the N-type heavily silicon-doped area in the second direction.

5. The optical waveguide detector according to claim 4, wherein an edge of the first heavily germanium-doped area on the first surface and closest to the N-type heavily silicon-doped area in the second direction coincides with the second edge.

6. The optical waveguide detector according to claim 1, wherein the germanium waveguide layer further comprises a second heavily germanium-doped area, the first surface further comprises a surface of the second heavily germanium-doped area, a width of the second heavily germanium-doped area is greater than 0 and less than or equal to half the width of the first surface, and a thickness of the second heavily germanium-doped area is greater than or equal to 5 nm and less than or equal to 200 nm;
    the first heavily germanium-doped area is a P-type heavily germanium-doped area, and the second heavily germanium-doped area is an N-type heavily germanium-doped area; and
    the upper cladding layer further comprises a second metal through-hole, and the second metal through-hole connects the second heavily germanium-doped area to the electrode layer.

7. The optical waveguide detector according to claim 6, wherein a distance between a central point of the first heavily germanium-doped area on the first surface and a first edge of the first surface is less than or equal to a distance between the central point of the first heavily germanium-doped area on the first surface and a second edge of the first surface;
    a distance between a central point of the second heavily germanium-doped area on the first surface and the first edge of the first surface is greater than or equal to a distance between the central point of the second heavily germanium-doped area on the first surface and the second edge of the first surface; and
    the first edge is an edge of the first surface close to the P-type heavily silicon-doped area in the second direction, and the second edge is an edge of the first surface close to the N-type heavily silicon-doped area in the second direction.

8. The optical waveguide detector according to claim 7, wherein an edge of the first heavily germanium-doped area on the first surface and closest to the P-type heavily silicon-doped area in the second direction coincides with the first edge, and an edge of the second heavily germanium-doped area on the first surface and closest to the N-type heavily silicon-doped area in the second direction coincides with the second edge.

9. The optical waveguide detector according to claim 6, wherein a gap exists between the first heavily germanium-doped area and the second heavily germanium-doped area.

10. The optical waveguide detector according to claim 1, wherein a width of the germanium-undoped area is greater than or equal to 100 nm and less than or equal to 2 µm.

11. An optical apparatus, comprising a processing circuit and an optical waveguide detector, wherein:
the optical waveguide detector is configured to convert an optical signal into an electrical signal, and the processing circuit is configured to process the electrical signal obtained by the optical waveguide detector;
wherein the optical waveguide detector comprises: a waveguide layer, an upper cladding layer, and an electrode layer that are stacked in a first direction, wherein the upper cladding layer is located between the waveguide layer and the electrode layer;
wherein the waveguide layer comprises a silicon waveguide layer and a germanium waveguide layer, and the germanium waveguide layer is located between the silicon waveguide layer and the upper cladding layer;
wherein the silicon waveguide layer comprises a P-type heavily silicon-doped area, a P-type lightly silicon-doped area, an N-type lightly silicon-doped area, and an N-type heavily silicon-doped area that are arranged in a second direction, the P-type lightly silicon-doped area is located between the P-type heavily silicon-doped area and the N-type lightly silicon-doped area, the N-type lightly silicon-doped area is located between the P-type lightly silicon-doped area and the N-type heavily silicon-doped area, and the second direction is perpendicular to the first direction;
wherein the germanium waveguide layer comprises a first heavily germanium-doped area and a germanium-undoped area, a first surface of the germanium waveguide layer comprises a surface of the first heavily germanium-doped area, the first surface is a surface of the germanium waveguide layer away from the silicon waveguide layer in the first direction, a width of the first heavily germanium-doped area is greater than 0 and less than or equal to half a width of the first surface, and a thickness of the first heavily germanium-doped area is greater than or equal to 5 nm and less than or equal to 200 nm; and
wherein the upper cladding layer comprises a first metal through-hole, and the first metal through-hole connects the first heavily germanium-doped area to the electrode layer.

12. The optical apparatus according to claim 11, wherein the first heavily germanium-doped area is a P-type heavily germanium-doped area, a distance between a central point of the first heavily germanium-doped area on the first surface and a first edge of the first surface is less than or equal to a distance between the central point and a second edge of the first surface, the first edge is an edge of the first surface close to the P-type heavily silicon-doped area in the second direction, and the second edge is an edge of the first surface close to the N-type heavily silicon-doped area in the second direction.

13. The optical apparatus according to claim 12, wherein an edge of the first heavily germanium-doped area on the first surface and closest to the P-type heavily silicon-doped area in the second direction coincides with the first edge.

14. The optical apparatus according to claim 11, wherein the first heavily germanium-doped area is an N-type heavily germanium-doped area, a distance between a central point of the first heavily germanium-doped area on the first surface and a first edge of the first surface is greater than or equal to a distance between the central point and a second edge of the first surface, the first edge is an edge of the first surface close to the P-type heavily silicon-doped area in the second direction, and the second edge is an edge of the first surface close to the N-type heavily silicon-doped area in the second direction.

15. The optical apparatus according to claim 14, wherein an edge of the first heavily germanium-doped area on the first surface and closest to the N-type heavily silicon-doped area in the second direction coincides with the second edge.

16. The optical apparatus according to claim 11, wherein the germanium waveguide layer further comprises a second heavily germanium-doped area, the first surface further comprises a surface of the second heavily germanium-doped area, a width of the second heavily germanium-doped area is greater than 0 and less than or equal to half the width of the first surface, and a thickness of the second heavily germanium-doped area is greater than or equal to 5 nm and less than or equal to 200 nm;
the first heavily germanium-doped area is a P-type heavily germanium-doped area, and the second heavily germanium-doped area is an N-type heavily germanium-doped area; and
the upper cladding layer further comprises a second metal through-hole, and the second metal through-hole connects the second heavily germanium-doped area to the electrode layer.

17. The optical apparatus according to claim 16, wherein a distance between a central point of the first heavily germanium-doped area on the first surface and a first edge of the first surface is less than or equal to a distance between the central point of the first heavily germanium-doped area on the first surface and a second edge of the first surface;
a distance between a central point of the second heavily germanium-doped area on the first surface and the first edge of the first surface is greater than or equal to a distance between the central point of the second heavily germanium-doped area on the first surface and the second edge of the first surface; and
the first edge is an edge of the first surface close to the P-type heavily silicon-doped area in the second direction, and the second edge is an edge of the first surface close to the N-type heavily silicon-doped area in the second direction.

18. The optical apparatus according to claim 17, wherein an edge of the first heavily germanium-doped area on the first surface and closest to the P-type heavily silicon-doped area in the second direction coincides with the first edge, and an edge of the second heavily germanium-doped area on the first surface and closest to the N-type heavily silicon-doped area in the second direction coincides with the second edge.

19. The optical apparatus according to claim 16, wherein a gap exists between the first heavily germanium-doped area and the second heavily germanium-doped area.

20. The optical waveguide detector according to claim 11, wherein a width of the germanium-undoped area is greater than or equal to 100 nm and less than or equal to 2 µm.

* * * * *